United States Patent
Liu et al.

(10) Patent No.: US 9,171,616 B2
(45) Date of Patent: Oct. 27, 2015

(54) MEMORY WITH MULTIPLE LEVELS OF DATA RETENTION

(71) Applicant: Macronix International Co., Ltd., Hsinchu (TW)

(72) Inventors: Ren-Shuo Liu, Taipei (TW); De-Yu Shen, New Taipei (TW); Chia-Lin Yang, Taipei (TW); Ye-Jyun Lin, New Taipei (TW); Cheng-Yuan Wang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/165,136

(22) Filed: Jan. 27, 2014

(65) Prior Publication Data

US 2015/0043274 A1    Feb. 12, 2015

Related U.S. Application Data

(60) Provisional application No. 61/863,922, filed on Aug. 9, 2013.

(51) Int. Cl.
G11C 13/00    (2006.01)
G11C 11/56    (2006.01)

(52) U.S. Cl.
CPC ........ G11C 13/0064 (2013.01); G11C 11/5678 (2013.01); G11C 13/0069 (2013.01)

(58) Field of Classification Search
CPC ............... G11C 11/35; G11C 13/0064; G11C 13/0069; H01L 29/66
USPC .................................... 365/148, 163, 185.24
See application file for complete search history.

(56) References Cited

U.S. PATENT DOCUMENTS

| | | | |
|---|---|---|---|
| 6,496,418 B2 * | 12/2002 | Kawahara et al. | 365/185.24 |
| 6,800,504 B2 | 10/2004 | Li et al. | |
| 7,903,457 B2 | 3/2011 | Lung | |
| 8,143,653 B2 * | 3/2012 | Cho et al. | 257/260 |
| 8,228,721 B2 * | 7/2012 | Lung | 365/163 |
| 2005/0029502 A1 | 2/2005 | Hudgens | |
| 2007/0176251 A1 | 8/2007 | Oh et al. | |
| 2010/0014343 A1 * | 1/2010 | Wei et al. | 365/148 |
| 2012/0170359 A1 | 7/2012 | Wu et al. | |

OTHER PUBLICATIONS

Gilbert, n. E., et al., "A macro model of programmable metallization cell devices," Solid-State Electronics 49 pp. 1813-1819, Nov. 2005.
Kang, D.-H., et al., "Two-bit Cell Operation in Diode-Switch Phase Change Memory Cells with 90 nm Technology", 2008 Symposium on Vlsi Technology Digest of Technical Papers, 17-19 Jun. 2008, pp. 98-99.

* cited by examiner

*Primary Examiner* — Son Mai
*Assistant Examiner* — Muna Techane
(74) *Attorney, Agent, or Firm* — Yiding Wu; Haynes Beffel & Wolfeld LLP

(57) ABSTRACT

A method for operating a memory includes receiving a command to program a data value at a memory cell, and an indication of which write mode in a plurality of write modes to use. Write modes in the plurality are characterized by different sets of resistance ranges that correspond to data values stored in the memory cell. The method includes executing a program operation according to the indicated one in the plurality of write modes to program the data value in the memory cell. The plurality of write modes includes a first write mode and a second write mode corresponding to shorter data retention than the first write mode. The first and second write modes are characterized by first and second sets of resistance ranges in the different sets of resistance ranges. The method includes periodically refreshing data values in memory cells storing data in the second write mode.

20 Claims, 14 Drawing Sheets

Resistance Ranges with Multiple Levels of Data Retention

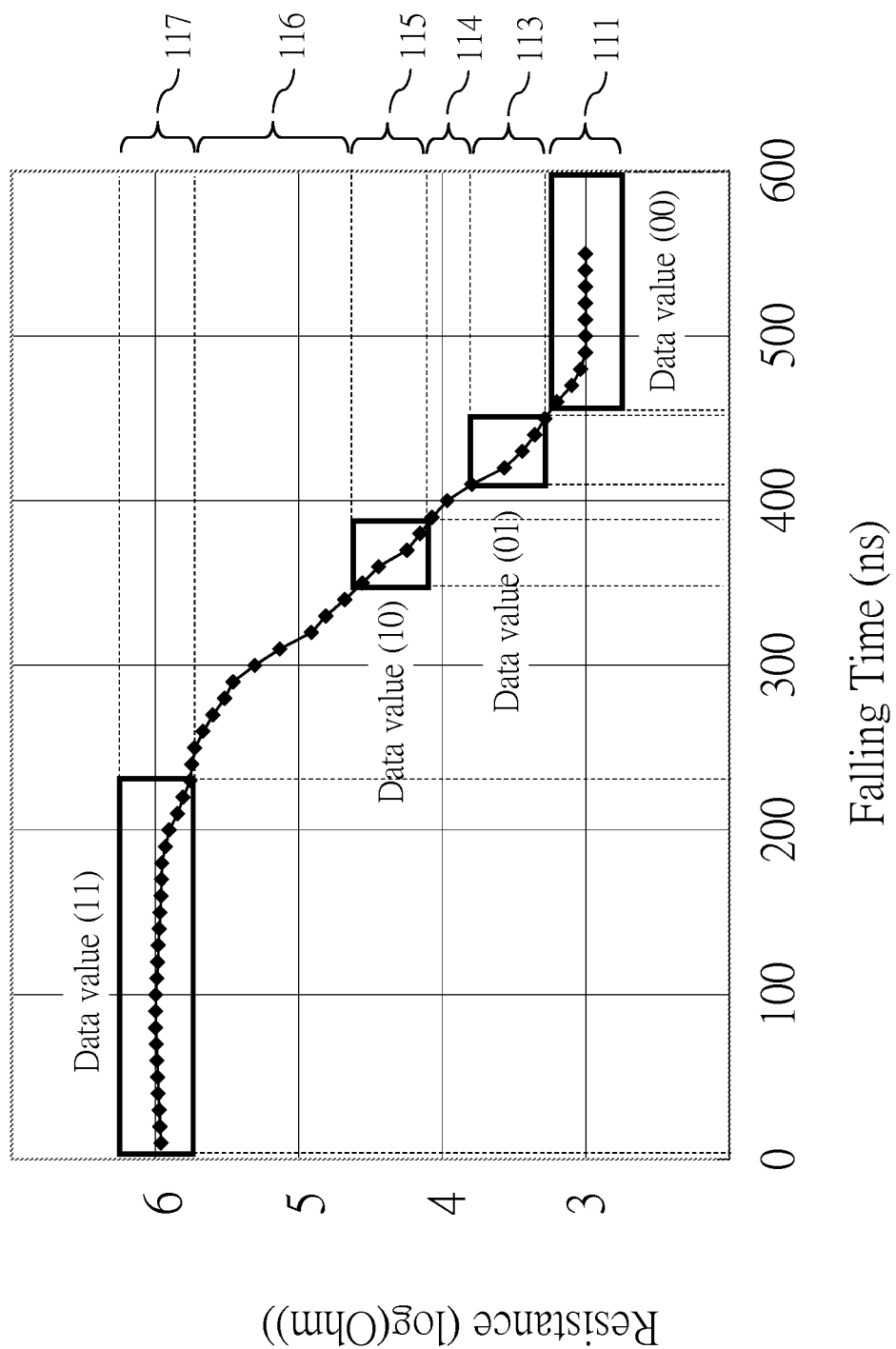
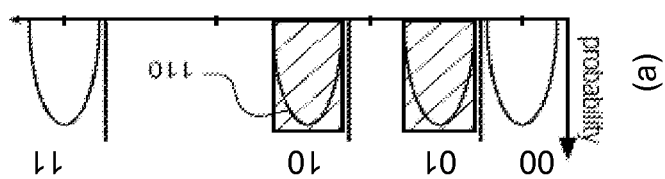
Figure 7

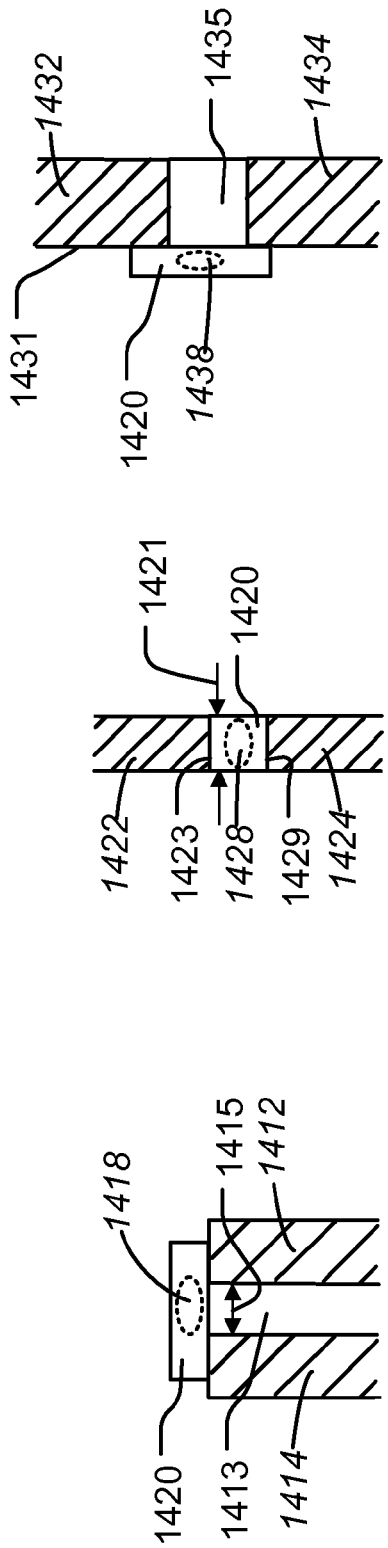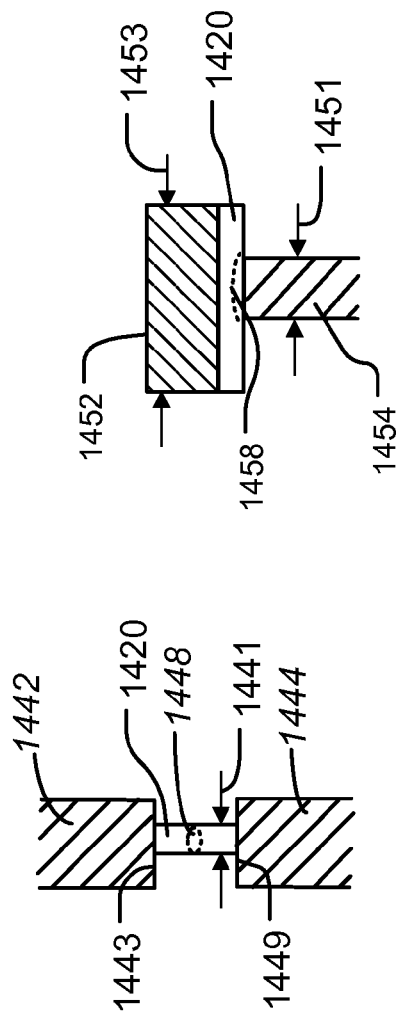
Figure 14

MEMORY WITH MULTIPLE LEVELS OF DATA RETENTION

RELATED APPLICATION

This application claims the benefit of U.S. Provisional Patent Application No. 61/863,922, filed 9 Aug. 2013, incorporated herein by reference.

BACKGROUND

1. Field of the Invention

The present application relates to phase change memory technology, and more particularly to phase change memory suitable for high density implementations.

2. Description of Related Art

PCM is a promising memory technology. PCM stores data by establishing higher resistance amorphous, and lower resistance crystalline phases in an active region of the cell, which result in a programmable level of resistance that represents data. PCM however can suffer a problem of structural relaxation of the crystalline phase material and recrystallization of the amorphous phase material over time in PCM which limits data retention. To increase data retention, the programming technique can require wide margins for safer long term storage. However, this comes at the cost of slower write procedures. Slow write can limit the usefulness of PCM memory in some high speed applications.

Thus, it is desirable to provide a technology that can expand the types of applications for PCM memory.

SUMMARY

A method for operating a memory, such as a PCM memory, is described that utilizes multiple write modes within the memory, where the write modes can have different write speeds and different data retention qualities.

One method described herein includes receiving a command to program a data value at a memory cell, and an indication of which write mode in a plurality of write modes to use. Write modes in the plurality are characterized by different sets of resistance ranges that correspond to data values stored in the memory cell. The method includes executing a program operation according to the indicated one in the plurality of write modes to program the data value in the memory cell. The plurality of write modes includes a first write mode and a second write mode corresponding to shorter data retention than the first write mode. The first write mode is characterized by a first set of resistance ranges in the different sets of resistance ranges. The second write mode is characterized by a second set of resistance ranges in the different sets of resistance ranges.

The first set of resistance ranges includes at least two resistance ranges that are non-overlapping, with a margin between the ranges. The second set of resistance ranges includes at least two resistance ranges that are non-overlapping, with a margin between the ranges. The margin between the two resistance ranges in the first set can be larger than a corresponding margin between the two resistance ranges in the second set to improve data retention performance.

The program operation can include the steps of 1) programming the data value at the memory cell by applying a write pulse to the memory cell to change resistance in the memory cell, where the write pulse is defined by a set of parameters corresponding to a target data value and the indicated one in the plurality of write modes; 2) verifying the memory cell by sensing resistance after applying the write pulse; and 3) if the memory cell fails verify, applying another write pulse to the memory cell defined using the set of parameters or a changed set of parameters.

The method can include periodically refreshing data values in memory cells in the memory storing data in the second write mode, while data values in memory cells in the memory storing data in the first write mode may not require refreshing. In some embodiments, refresh operations skip memory cells having data stored in the first write mode.

The refresh operation can include the steps of 1) sensing resistance of a memory cell in the memory cells storing data in the second write mode; and 2) if the sensed resistance is within a particular resistance range in the second set of resistance ranges or within a margin between the particular resistance range and an adjacent resistance range in the second set of resistance ranges, applying a write pulse to the memory cell to change resistance in the memory cell, where the write pulse is defined by a set of parameters corresponding to the particular resistance range; and 3) verifying the memory cell by sensing resistance after applying the write pulse; and 4) if the memory cell fails verify, applying another write pulse to the memory cell defined using a changed set of parameters.

As described herein, the second set of resistance ranges can include a low resistance range, one or more intermediate resistance ranges and a high resistance range that are non-overlapping. In one embodiment, the refresh operation applies the write pulse when the particular resistance range is one of the one or more intermediate resistance ranges and not when the particular resistance range is one of the low resistance range and the high resistance range.

Alternatively, the refresh operation can include the steps of 1) sensing resistance of a memory cell in the memory cells storing data in the second write mode (such as by applying a sensing threshold corresponding to a high boundary or corresponding to a low boundary of a resistance range); and 2) if the sensed resistance is within a particular resistance range (e.g., below a sensing threshold) in the one or more intermediate resistance ranges in the second set of resistance ranges or within a margin between the particular resistance range and an adjacent resistance range in the second set of resistance ranges, applying a write pulse to the memory cell to change resistance in the memory cell, where the write pulse is defined by a set of parameters corresponding to a resistance range in the first set of resistance ranges such as used in the first write mode, and the resistance range represents a same data value as the particular resistance range; and 3) verifying the memory cell by sensing resistance after applying the write pulse; and 4) if the memory fails verify, applying another write pulse to the memory cell defined using a changed set of parameters.

The set of parameters can include a falling time of a write pulse from a first current value to a second current value lower than the first current value. The set of parameters may be implemented by dedicated circuitry used to generate the write pulse, or in some embodiments, may be implemented using control registers and circuitry responsive to the control registers to generate the write pulse, and may be implemented using a combination of dedicated circuitry and control registers. In some embodiments, different lengths of error-correcting codes (ECCs) can be generated and stored on data values in memory cells in the memory storing data in different write modes in the plurality of write modes.

A memory device is also described configured to execute the methods described herein.

Other aspects and advantages of the present invention can be seen on review of the drawings, the detailed description and the claims, which follow.

BRIEF DESCRIPTION OF THE DRAWINGS

FIG. 7 is a chart illustrating a set of resistance ranges vs falling time of a write pulse for a level of relatively longer data retention in phase change memory.

FIGS. 14A-14E show alternative memory cell structures which may be implemented in the memory cells of the memory array.

DETAILED DESCRIPTION

Figure 1:
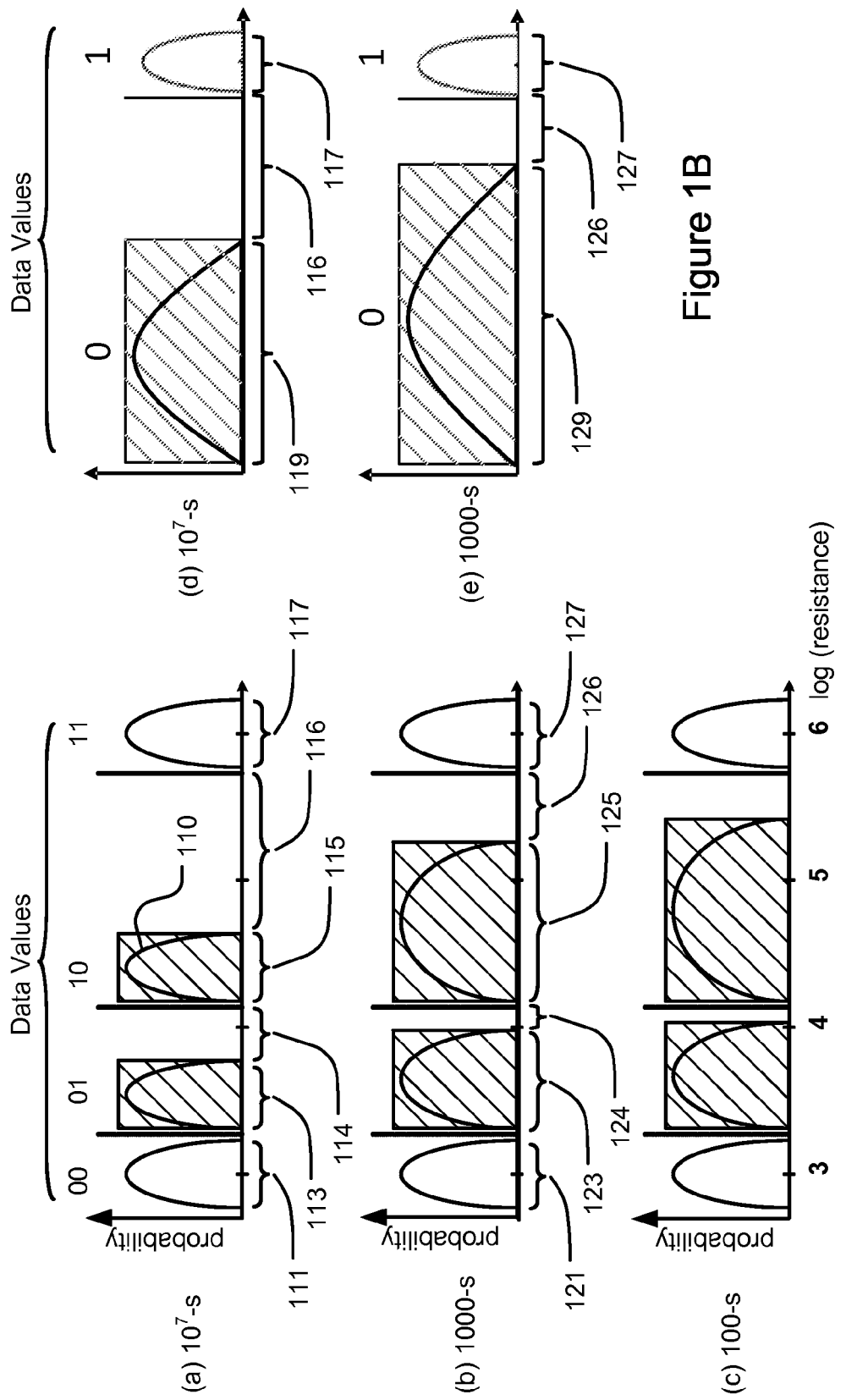
FIG. 1A illustrates resistance ranges for multiple levels of data retention corresponding to different write modes and data values stored in multiple level memory cells.
FIG. 1B illustrates resistance ranges for multiple levels of data retention corresponding to different write modes and data values stored in single level memory cells.

A detailed description of various embodiments is described with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1A illustrates resistance ranges for multiple levels of data retention corresponding to different write modes and data values stored in multiple level memory cells in a memory, which can be on an integrated circuit, or in a memory system comprising a plurality of integrated circuits. The memory cells in the memory use a uniform memory cell structure and the same phase change material, such that the memory cells have uniform operational memory characteristics, such as voltage transition threshold and switching speeds. Examples of uniform memory cell structures are described in connection to FIGS. 14A-14E. Examples of phase change materials that can be used as the same phase change material are described herein.

As describe herein, a write mode in a plurality of write modes can be used to program a data value at a memory cell. Write modes in the plurality of write modes are characterized by different sets of resistance ranges that correspond to data values stored in the memory cell. The plurality of write modes can include a first write mode and a second write mode corresponding to shorter data retention than the first write mode. The first write mode can be characterized by a first set of resistance ranges in the different sets of resistance ranges that corresponds to data values stored in the memory cell, and the second write mode can be characterized by a second set of resistance ranges in the different sets of resistance ranges that corresponds to data values stored in the memory cell. The second set of resistance ranges is different than the first set.

A level of relatively longer data retention corresponds to tighter resistance ranges, and wider margins between the resistance ranges than a level of relatively shorter data retention. However, a level of relatively longer data retention also requires a more precise and therefore slower write procedure. In comparison, a level of relatively shorter data retention corresponds to wider resistance ranges, and narrower margins between the wider resistance ranges. A level of relatively shorter data retention also requires fewer verify iterations and therefore a faster write procedure.

FIG. 1A includes graph (a) showing resistance ranges suitable for longer data retention such as $10^7$ seconds, or about three months, of retention time. Graph (b) shows resistance ranges suitable for intermediate data retention such as 1000 seconds of retention time. Graph (c) shows resistance ranges suitable for shorter data retention such as 100 seconds of retention time. For instance, the plurality of write modes, such as three different write modes, can be characterized by different sets of resistance ranges shown in graphs (a), (b) and (c). For a multiple level memory cell (MLC) with 2 data bits, data values 00, 01, 10 and 11 can be stored in the memory cell.

For a multiple level memory cell, the first set of resistance ranges can include a low resistance range, one or more intermediate resistance ranges and a high resistance range that are non-overlapping, and has margins between the ranges. The second set of resistance ranges includes a low resistance range, one or more intermediate resistance ranges and a high resistance range that are non-overlapping, and has margins between the ranges. The margin between one of the intermediate ranges and another one of the ranges in the first set is larger than a corresponding margin between the ranges in the second set.

In one embodiment, as illustrated in Graph (a) of FIG. 1A, the first set of resistance ranges can include non-overlapping resistance ranges 111, 113, 115 and 117 corresponding to data values 00, 01, 10 and 11, respectively. As illustrated in Graph (b) of FIG. 1A, the second set of resistance ranges can include non-overlapping resistance ranges 121, 123, 125 and 127 corresponding to data values 00, 01, 10 and 11, respectively. A margin (e.g. 116) between one of the intermediate ranges (e.g. 115) and another one of the ranges (e.g. 117) in the first set is larger than a corresponding margin (e.g. 126) between the ranges (e.g. 125 and 127) in the second set. Similarly, a margin (e.g. 114) between one of the intermediate ranges (e.g. 113) and another one of the ranges (e.g. 115) in the first set is larger than a corresponding margin (e.g. 124) between the ranges (e.g. 123 and 125) in the second set.

FIG. 1B illustrates resistance ranges for multiple levels of data retention corresponding to different write modes and data values stored in single level memory cells in a memory. In general, description for resistance ranges for multiple levels of data retention corresponding to different write modes and data values stored in multiple level memory cells applies to single level memory cells.

FIG. 1B includes graph (d) showing resistance ranges suitable for longer data retention such as $10^7$ seconds, or about three months, of retention time. Graph (e) shows resistance ranges suitable for intermediate data retention such as 1000 seconds of retention time. For instance, the plurality of write modes, such as two different write modes, can be characterized by different sets of resistance ranges shown in graphs (d) and (e). For a single level memory cell (SLC) with 1 data bit, data values 0 and 1 can be stored in the memory cell.

In one embodiment, as illustrated in the example of FIG. 1B, for a single level memory cell, the first set of resistance ranges includes a low resistance range 119, and a high resistance range 117 that are non-overlapping, and has a margin 116 between the ranges, as shown in graph (d). The second set of resistance ranges includes a low resistance range 129, and a high resistance range 127 that are non-overlapping, and has a margin 126 between the ranges, as shown in graph (e). The margin 116 between the low and high ranges 119 and 117 corresponding to data values 0 and 1 in the first set is larger than a corresponding margin 126 between the low and high ranges 129 and 127 corresponding to data values 0 and 1 in the second set as shown in graph (e). As described herein, tighter resistance ranges and wider margins correspond to longer data retention.

Figure 2:
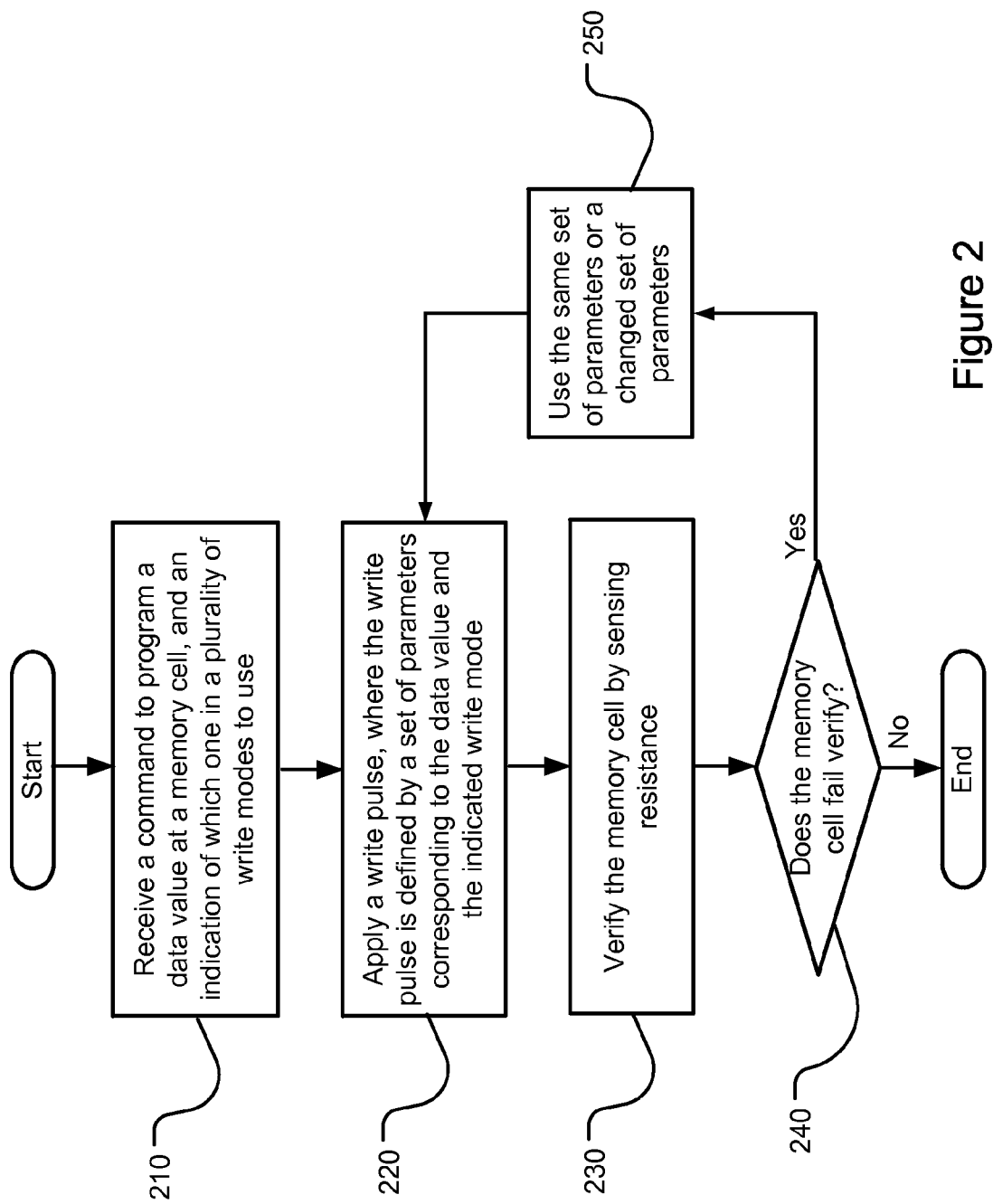
FIG. 2 is a flowchart illustrating an iterative write procedure for selecting data retention levels when writing memory cells.

FIG. 2 is a flowchart illustrating an iterative write procedure for selecting data retention levels when writing memory cells. At Step 210, a memory receives a command to program a data value at a memory cell in the memory, and an indication of which write mode in a plurality of write modes to use. A program operation is then executed by the memory according to the indicated one in the plurality of write modes to program the data value in the memory cell. In different embodiments, the indication of which write mode in a plurality of write modes to use as described in connection with FIG. 2 can be communicated, for examples, via a reserved field in an existing command received by the memory, an additional command received by the memory, use of an address within a specified range, or a dedicated pin on the memory.

At Step 220, the program operation can include programming the data value at the memory cell by applying a write pulse to the memory cell to change resistance in the memory cell, where the write pulse is defined by a set of parameters corresponding to a target data value and the indicated one in the plurality of write modes. At Step 230, the program operation can include verifying the memory cell by sensing resistance after applying the write pulse. At Step 240, if the memory cell fails verify, the memory cell is applied another write pulse defined using the same set of parameters or a changed set of parameters (Step 250). The iterative write procedure ends when the resistance of the memory cell is set to a resistance range representing the data value in the indicated one in the plurality of write modes, as indicated by a successful verify at Step 240, or when an error condition is encountered (not shown).

The set of parameters for the write pulse can include falling time, pulse width, amplitude, step counts, and step size, as described in connection with FIGS. 6, 7, and 8. The set of parameters and values of the parameters in the set can vary from one memory technology (e.g. PCM (phase change memory)) to another (e.g. ReRAM (Resistive Random Access Memory)), or within the same memory technology depending on the implementation of a memory cell and its associated write driver.

The memory includes a controller (e.g. 1269, FIG. 12) coupled to the memory cells, including logic to execute the iterative write procedure for selecting data retention levels when writing memory cells as illustrated in FIG. 2.

Figure 3:
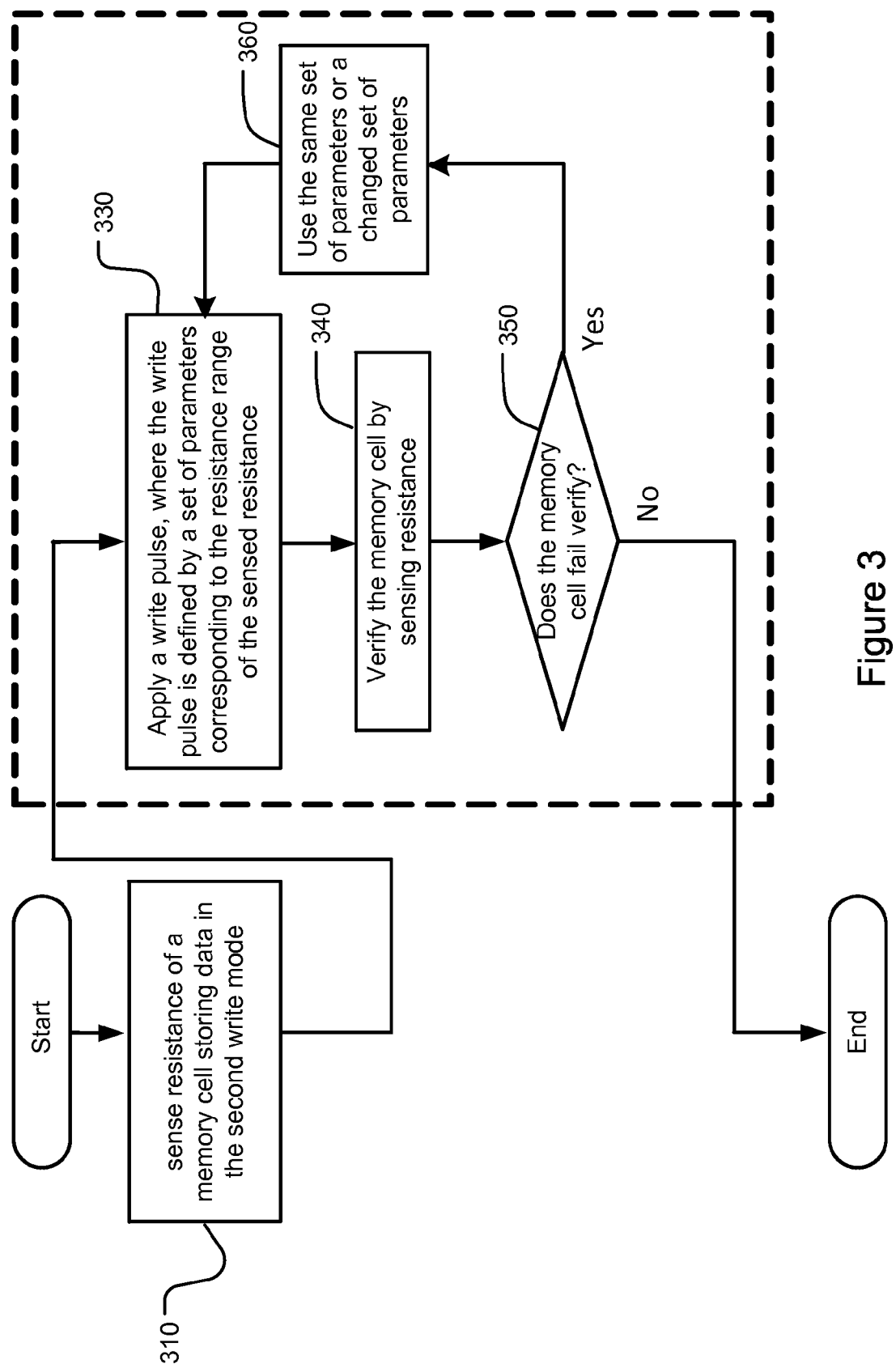
FIG. 3 is a flowchart illustrating an iterative refresh procedure for refreshing data values in memory cells in the memory storing data in the second write mode.

FIG. 3 is a flowchart illustrating an iterative refresh procedure for refreshing data values in memory cells in the memory storing data in the second write mode, while data values in memory cells in the memory storing data in the first write mode may not require refreshing. In some embodiments, refresh operations skip memory cells having data stored in the first write mode.

As illustrated in the example of FIG. 3, at Step 310, resistance of a memory cell in the memory cells storing data in the second write mode is sensed. When the memory cell is sensed, the resistance of the memory cell can drift outside resistance ranges, and a determination is made on whether the sensed resistance is within a particular resistance range in the second set of resistance ranges or within a margin between the particular resistance range and an adjacent resistance range in the second set of resistance ranges. At Step 330, depending on the results of the sensing, a write pulse is applied to the memory cell to change resistance in the memory cell, where the write pulse is defined by a set of parameters corresponding to the particular resistance range. At Step 340, the memory cell is verified by sensing resistance after the write pulse is applied. At Step 350, if the memory cell fails verify, the memory cell is applied another write pulse defined using the same set of parameters or a changed set of parameters (Step 360).

Figure 4:
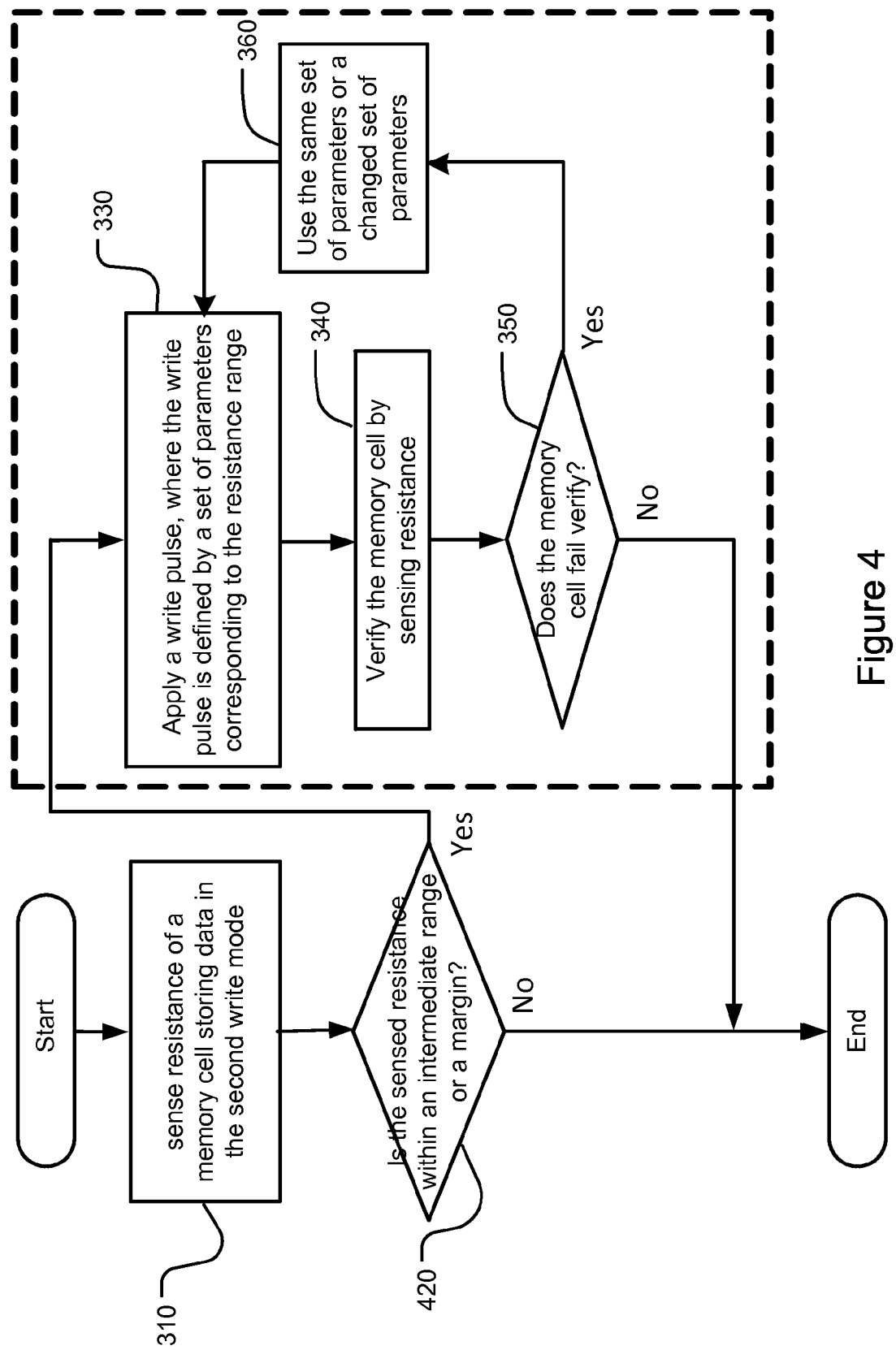
FIG. 4 is an alternative flowchart to FIG. 3.

FIG. 4 is an alternative flowchart to FIG. 3, illustrating an iterative refresh procedure for refreshing data values in memory cells in the memory storing data in the second write mode, while data values in memory cells in the memory storing data in the first write mode may not require refreshing. In some embodiments, refresh operations skip memory cells having data stored in the first write mode. As described herein, the second set of resistance ranges for the second write mode can include a low resistance range (e.g. 121 in FIG. 1A), one or more intermediate resistance ranges (e.g. 123, 125 in FIG. 1A) and a high resistance range (e.g. 127 in FIG. 1A) that are non-overlapping. FIG. 4 uses corresponding reference numerals 310, 330, 340, 350 and 360 to refer to corresponding steps as in FIG. 3.

As illustrated in the example of FIG. 4, at Step 310, resistance of a memory cell in the memory cells storing data in the second write mode is sensed. At Step 420, a determination is made on whether the particular resistance range is one of the one or more intermediate resistance ranges in the second set of resistance ranges for the second write mode or within a margin between the particular resistance range and an adjacent resistance range in the second set of resistance ranges. The determination can be made by comparing the sensed resistance of the memory cell against pre-determined threshold values for the intermediate resistance ranges. Steps 330, 340, 350 and 360 of the iterative refresh procedure are applied only if the particular resistance range is one of the one or more intermediate resistance ranges (e.g. 123, 125 in FIG. 1A). The iterative refresh procedure as illustrated in FIG. 4 is applicable when the low resistance range and the high resistance range do not have resistance drift significant enough to affect representation of data values, and therefore refreshing can be inhibited for the low and high resistance ranges.

At Step 330, a write pulse is applied to the memory cell to change resistance in the memory cell, where the write pulse is defined by a set of parameters corresponding to the particular resistance range. At Step 340, the memory cell is verified by sensing resistance after the write pulse is applied. At Step 350, if the memory cell fails verify, the memory cell is applied another write pulse defined using the same set of parameters or a changed set of parameters (Step 360).

Figure 5:
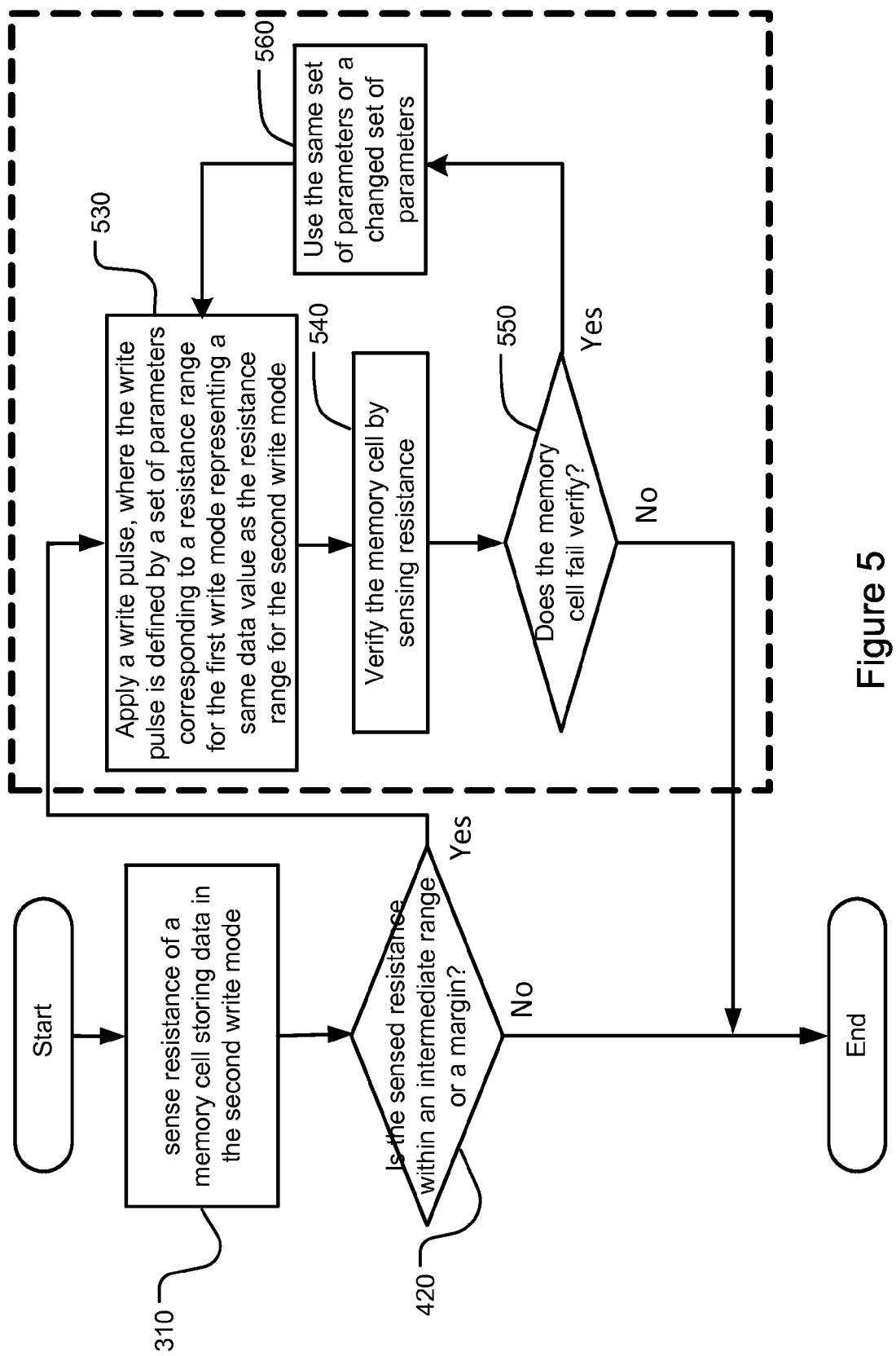
FIG. 5 is an alternative flowchart to FIG. 4.

FIG. 5 is an alternative flowchart to FIG. 4, illustrating an iterative refresh procedure for refreshing data values in memory cells in the memory storing data in the second write mode. Steps 310, 420, 540, 550 and 560 in FIG. 5 correspond to Steps 310, 420, 340, 350 and 360 in FIG. 4. As in FIG. 4, the iterative refresh procedure is applied in FIG. 5 only if the particular resistance range is one of the one or more intermediate resistance ranges (e.g. 123, 125 in FIG. 1A). The difference between FIG. 4 and FIG. 5 is in Step 530. In Step 530, the memory cell is applied a write pulse to the memory cell to change resistance in the memory cell. The write pulse is defined by a set of parameters corresponding to a resistance range in the first set of resistance ranges for the first write mode, where the resistance range represents a same data value represented by the resistance sensed at Step 310 in the second resistance range for the second write mode.

As described herein, the first write mode can be for longer data retention and the second write mode can be for shorter data retention. By using a write pulse defined by a set of parameters for a resistance range for the first write mode, the iterative refresh procedure as illustrated in FIG. 5 can set a longer data retention level for the data stored in the memory cell.

The iterative refresh procedures as illustrated in FIGS. 3-5 can be periodically executed to refresh data values in memory cells in the memory storing data in the second write mode. The memory includes a controller (e.g. 1269, FIG. 12) coupled to the memory cells, including logic to execute the iterative refresh procedures as illustrated in FIGS. 3-5.

Memory cells storing data in the first write mode can also be refreshed with a longer refresh intervals than refresh intervals for the second write mode, such that extra power and extra bank usage due to refreshing are reduced for the first write mode. For instance, a refresh interval for the first write mode can be 10^7 seconds, while a refresh interval for the second write mode can be 10^3 seconds. Actual refresh intervals depend on implementations of the method described herein. Extra power and extra bank usage as a function of refresh interval are described in connection with FIG. 11. The memory includes a controller (e.g. 1269, FIG. 12) coupled to the memory cells, including logic to refresh memory cells storing data in the first write mode with a longer refresh intervals than refresh intervals for the second write mode.

Figure 6:
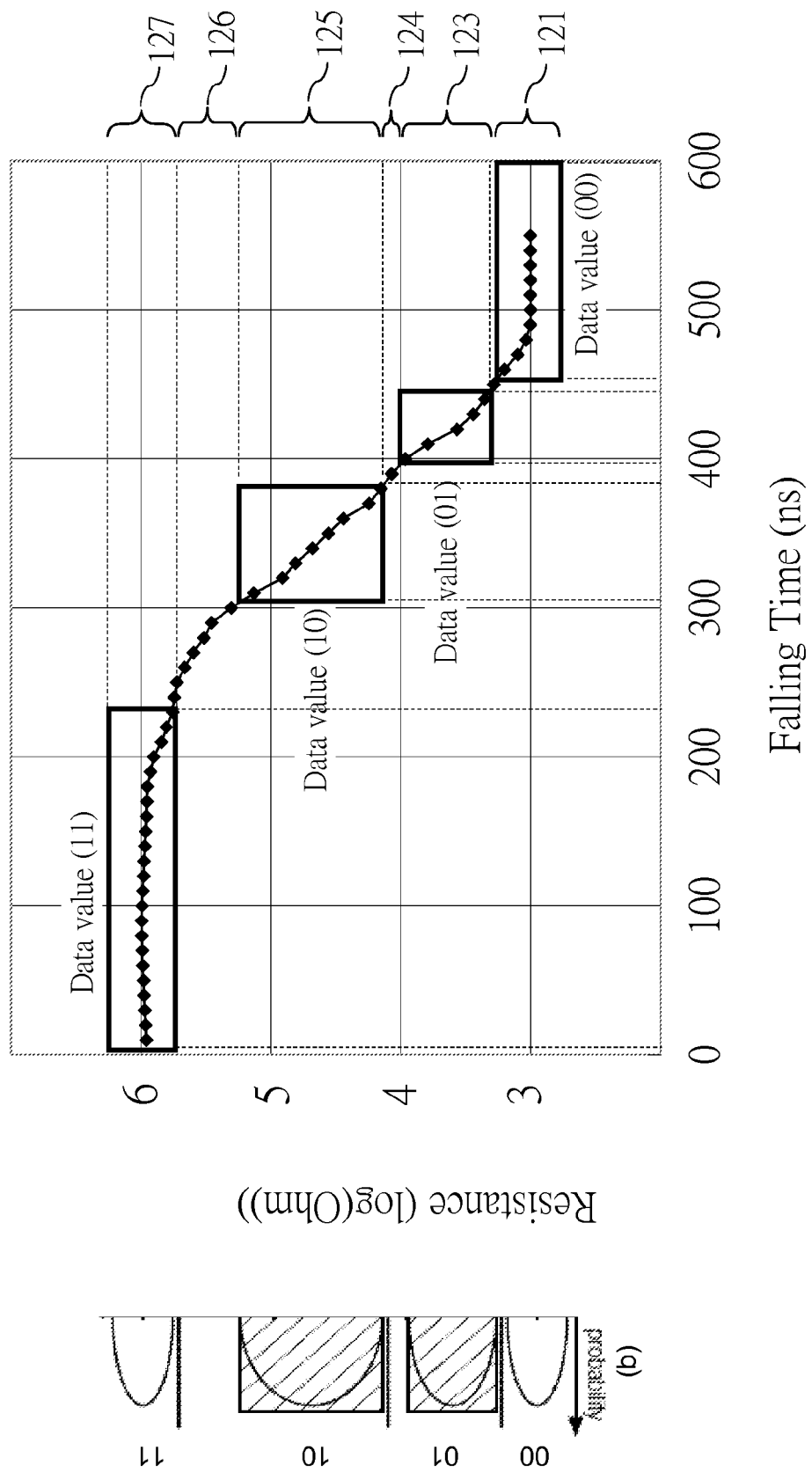
FIG. 6 is a chart illustrating a set of resistance ranges vs falling time of a write pulse for a level of relatively shorter data retention in phase change memory.

FIG. 6 is a chart illustrating a set of resistance ranges vs falling time of a write pulse for a level of relatively shorter data retention in phase change memory. As an example, four resistance ranges are shown in the set, corresponding to data values 00, 01, and 11 for a two-bit memory cell. Graph (b) in FIG. 1A is reproduced in FIG. 6, and rotated 90 degrees counter-clockwise. Reference numerals 121-127 in FIG. 6 correspond to the same reference numerals used in graph (b) in FIG. 1A. The resistance range 121 corresponding to data value 00 is a low resistance range. The resistance range 127 corresponding to data value 11 is a high resistance range. The resistance ranges 123 and 125 corresponding to data values 01 and 10 are intermediate resistance ranges. The four resistance ranges are non-overlapping. The set of resistance ranges has margins between the resistance ranges.

The resistance ranges vary with the falling time of the write pulse. In general, a longer fall time is needed for a lower resistance range, and a shorter fall time is needed for a higher resistance range. For instance, to write data value 10 in the level of relatively shorter data retention, a falling time of 340 ns can be selected for the write pulse, and to write data value 01, a falling time of 420 ns can be selected for the write pulse.

After a memory cell is applied the write pulse using a selected falling time, the memory cell is verified by sensing its resistance. If the sensed resistance is larger or smaller than the resistance range for the data value in the level of relatively shorter data retention, the falling time can be increased or decreased. The memory cell can be applied a write pulse again with the increased or decreased falling time along with other changed parameters, and re-verified, until the sensed resistance is within the resistance range for the data value.

FIG. 7 is a chart illustrating a set of resistance ranges vs falling time of a write pulse for a level of relatively longer data retention in phase change memory. Graph (a) in FIG. 1A is reproduced in FIG. 7, and rotated 90 degrees counter-clockwise. Reference numerals 111-117 in FIG. 7 correspond to the same reference numerals used in graph (a) in FIG. 1A. Similar to FIG. 6, four resistance ranges are shown in the set, corresponding to data values 00, 01, 10 and 11 for a two-bit memory cell. The resistance range 111 corresponding to data value 00 is a low resistance range. The resistance range 117 corresponding to data value 11 is a high resistance range. The resistance ranges 113 and 115 corresponding to data values 01 and 10 are intermediate resistance ranges. The four resistance ranges are non-overlapping. The set of resistance ranges has margins between the resistance ranges.

The margin between a particular resistance range and an adjacent resistance range in the set for a level of relatively longer data retention as shown in FIG. 7 is wider than a corresponding margin in the set for a level of relatively shorter data retention as shown in FIG. 6. For instance, the margin 116 between the resistance ranges 117 and 115 for data values 11 and 10 in FIG. 7 is larger than a corresponding margin 126 between the resistance ranges 127 and 125 for data values 11 and 10 in FIG. 6. For another instance, the margin 114 between the resistance ranges 115 and 113 for data values 10 and 01 in FIG. 7 is larger than a corresponding margin 124 between the resistance ranges 125 and 123 for data values 10 and 01 in FIG. 6.

The resistance ranges vary with the falling time of the write pulse for a level of relatively longer data retention. For instance, to write data value 10, a falling time of 360 ns can be selected for the write pulse, and to write data value 01, a falling time of 430 ns can be selected for the write pulse. An iterative program and verify procedure can be executed until the sensed resistance is within the resistance range for the data value for a level of relatively longer data retention.

For a level of relatively longer data retention, a memory cell has a tighter resistance range for a particular data value and a wider margin between the tighter resistance range and an adjacent resistance range than for a level of relatively shorter data retention. Therefore more verify iterations may be needed to program a memory cell for a level of relatively longer data retention than for a level of relatively shorter data retention.

A memory can be partitioned into sections for respective use with a level of relatively longer data retention or a level of relatively shorter data retention. For example, a section can be a page of data or multiple pages of data. Alternatively, a controller can select a level of data retention for memory cells at different locations in the memory. A particular location in a memory can be alternatively programmed for a level of relatively longer data retention or a level of relatively shorter data retention, depending on requirements by applications that use the memory.

Figure 8B:
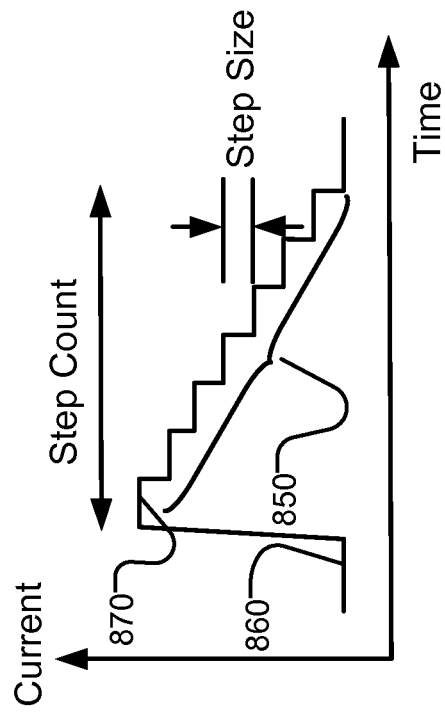
FIGS. 8A and 8B are charts illustrating parameters for a write pulse.
Figure 8A:
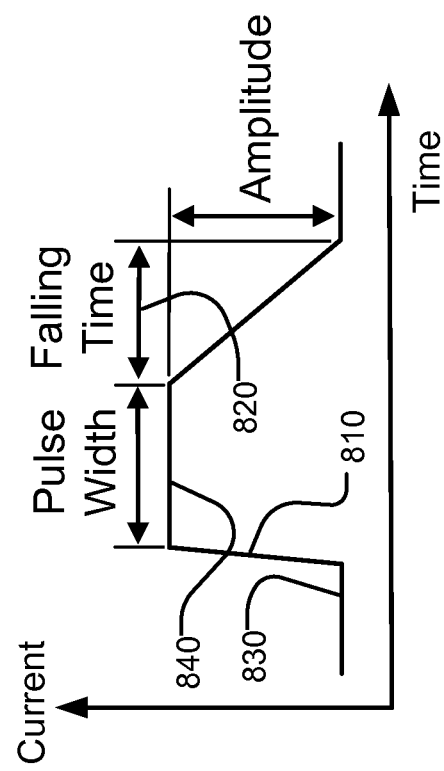

FIGS. 8A and 8B are charts illustrating parameters for a write pulse. In addition to the falling time as an example of a parameter in a set of parameters defining a write pulse as described in FIG. 6 and FIG. 7, other examples of parameters in the set of parameters can include pulse width, amplitude, step count and step size of the write pulse. Different pulse shapes, such as defined by width, amplitude, step size, and step count, are used to achieve different resistance ranges. For instance, to make a memory cell reach a higher resistance range, shorter pulse widths with higher amplitudes are used than for a lower resistance range. For another instance, to make a cell reach a higher resistance range, larger step sizes are used than for a lower resistance range.

As illustrated in FIG. 8A, a pulse width in time is between a rising time 810 and a falling time 820, and an amplitude in current is between a bottom current level 830 and a peak current level 840. As illustrated in FIG. 8B, a falling edge 850 is executed in a step count number of steps in current to drop the current from a peak current level 870 to a bottom current level 860. A step size for a step in the step count number of steps can be the same as or different from other steps. A sum of all steps can be the amplitude as illustrated in FIG. 8A.

In one embodiment, a "memory-less" write can be used with the present technology. A "memory-less" write as used in the present specification means that a write pulse to set a memory cell to within a resistance range is defined by selection of a set of parameters independent of (without memory of) a previous resistance state of the memory cell before the write pulse is applied, such as by causing target cells to transition to amorphous or melted phase in the active regions in the write pulse, and then setting the final resistance to that of a target data value by controlling the write pulse shape. This prevents the need to maintain more complex program sequences to account for different possible transitions in resistance ranges.

Figure 9:
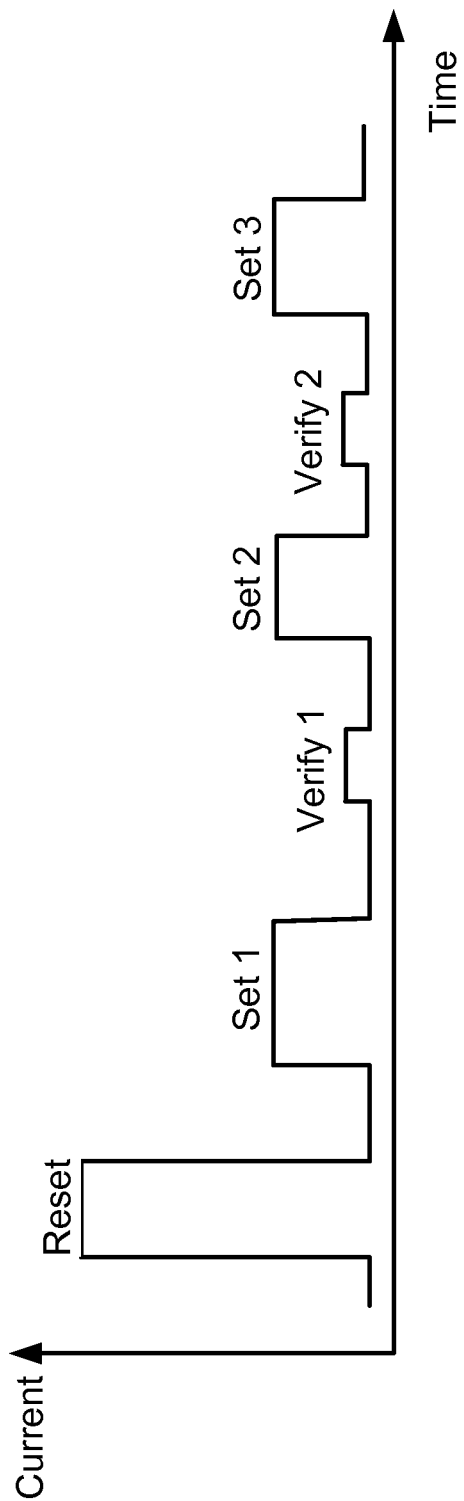
FIG. 9 illustrates an example of a "memory-less" write.

FIG. 9 illustrates an example of a "memory-less" write, where a reset pulse (Reset) is applied to a memory cell before one or more write pulses (e.g. Set1, Set 2, Set3) are applied to the memory cell. After the reset pulse is applied, the memory cell is at an initial state regardless of the previous resistance state of the memory cell. Because the reset pulse is applied before the write pulses, selection of a set of parameters for a first write pulse (e.g. Set 1) is based on the data value and the indicated write mode. For instance, in FIG. 2, before Step 220 is executed to apply a write pulse for the first time, such a reset pulse can be applied. After each write pulse is applied, a verify pulse is applied to sense the resistance. Depending on the sensed resistance, the next write pulse can be shorter than, longer than, or the same as the previous write pulse. A verify pulse requires a lower current than a write pulse. For instance, after the first write pulse Set 1, a verify pulse Verify 1 is applied, and after the second write pulse Set 2, a verify pulse Verify 2 is applied.

Figure 10:
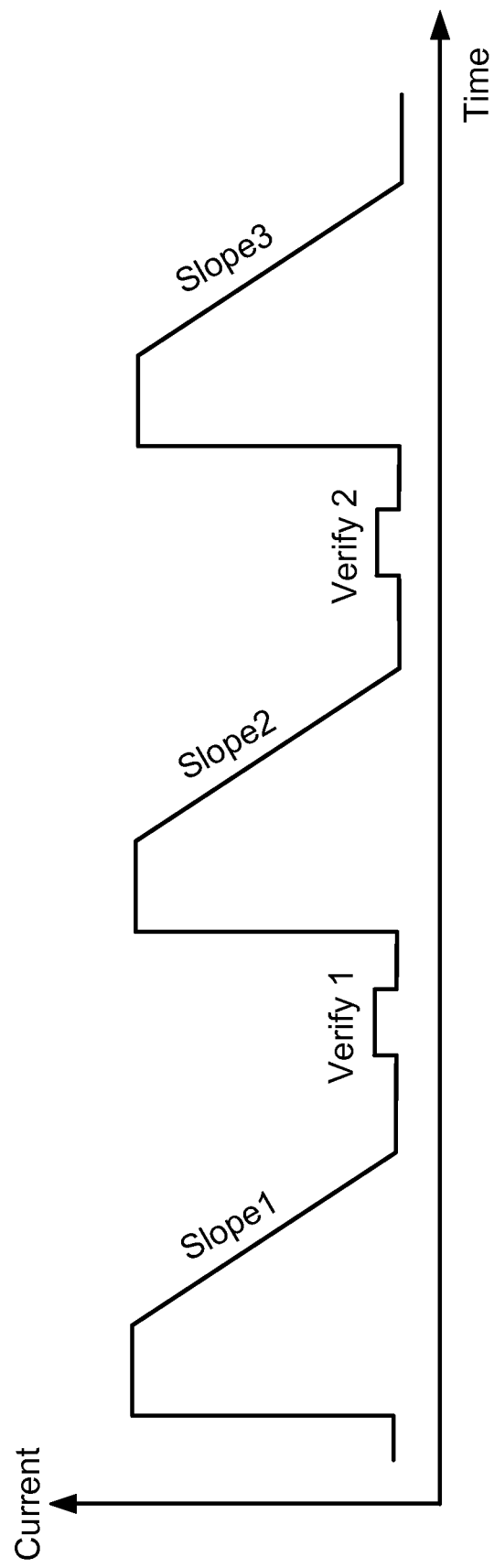
FIG. 10 illustrates an alternative example of a "memory-less" write.

FIG. 10 illustrates an alternative example of a "memory-less" write, where each write pulse is a trapezoid pulse. The trapezoid pulse is equivalent to a reset pulse followed by a tail whose slope is adjustable. Because of the equivalent reset pulse, selection of a set of parameters for the first pulse including the first slope (e.g. Slope 1) is independent of the previous resistance state of the memory cell. After each write pulse is applied, a verify pulse is applied to sense the resistance. Depending on the sensed resistance, the next write pulse can include a faster or slower slope than or a same slope as the slope in the previous write pulse. A verify pulse requires a lower current than a write pulse. For instance, after the first write pulse with Slope1, a verify pulse Verify 1 is applied, and after the second write pulse with Slope2, a verify pulse Verify 2 is applied.

Figure 11:
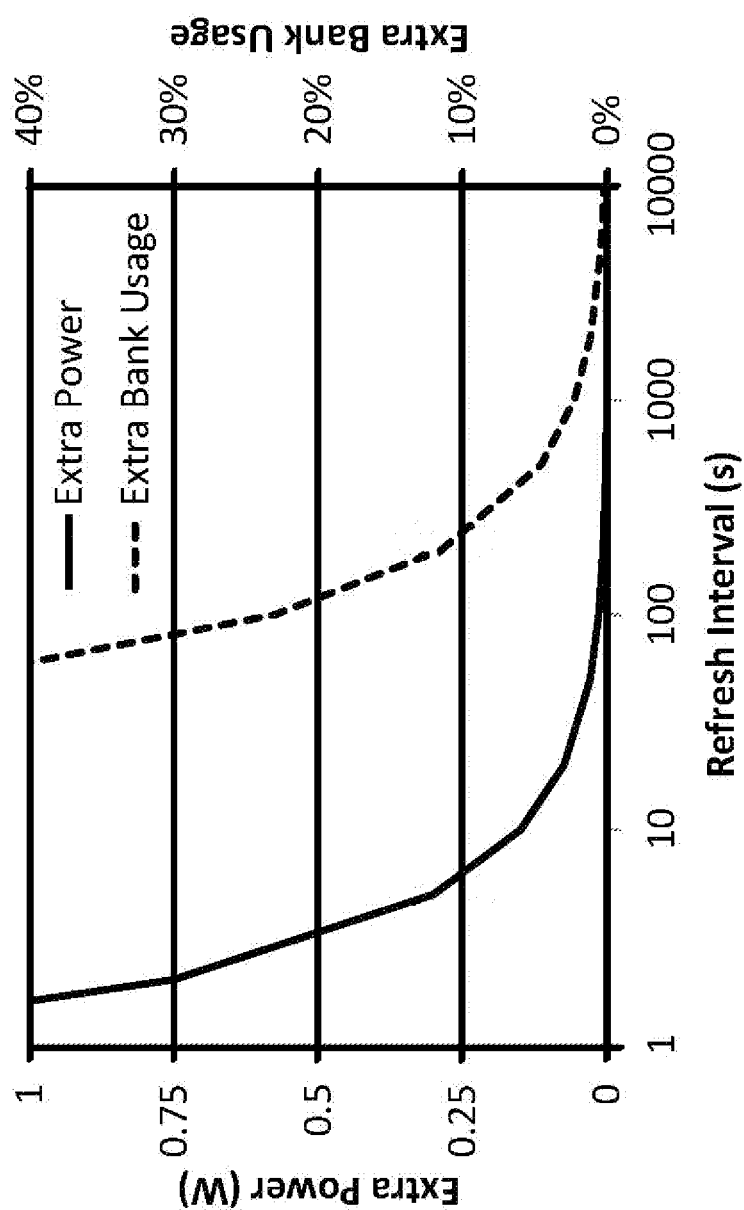
FIG. 11 is a chart illustrating extra power and extra bank usage as a function of refresh interval for refreshing memory cells storing data values with multiple levels of data retention.

FIG. 11 is a chart illustrating extra power and extra bank usage as a function of refresh interval, associated with the method as described herein for refreshing memory cells storing data values with multiple levels of data retention. The chart is based on analytic models. Extra power and extra bank usage depend on refresh intervals. In general, shorter refresh intervals incur more extra power and extra bank usage.

In the chart, the horizontal axis is the refresh interval in seconds, the left vertical axis is extra power in watts (W), and the right vertical axis is extra bank usage in percentage (%). The solid curve shows the extra power as a function of refresh interval, while the dotted curve shows the extra bank usage as a function of refresh interval. As illustrated in the chart, when the refresh interval is 1000 seconds or longer, the extra power approaches 0 watt. Also, when the refresh interval is 1000 seconds or longer, the extra bank usage decreases from approximately 3% to approximately 0%. Accordingly, the method as described herein does not incur significant overhead in power and bank usage. A shorter refresh interval means lower data retention requirements for a PCM cell, which can thus achieve a higher write speed. As illustrated in FIG. 11, a range of refresh intervals between 1000~10000 seconds does not incur significant overhead in power and bank usage. Accordingly, the range of refresh intervals between 1000~10000 seconds includes preferable values for data retention of the second write mode.

Refreshing memory cells can require relatively large currents. To meet current limitations, only a limited number of memory cells can be refreshed simultaneously. Refreshing a row of memory cells in PCM can also degrade the responsiveness of the memory. Therefore, memory cells can be refreshed with a finer granularity than a row, e.g., a cache line, at a time. A row corresponds to memory cells selected by a word line. For instance, a row can have 2 to 16 kilo bytes of data. A cache line corresponds to an accessing size by a CPU (central processing unit). For instance, a cache line can have 64 to 256 bytes of data. In different embodiments, memory cells on a cache line can be programmed for a level of relatively longer data retention, for a level of relatively shorter data retention, or for mixed levels of data retention.

Figure 12:
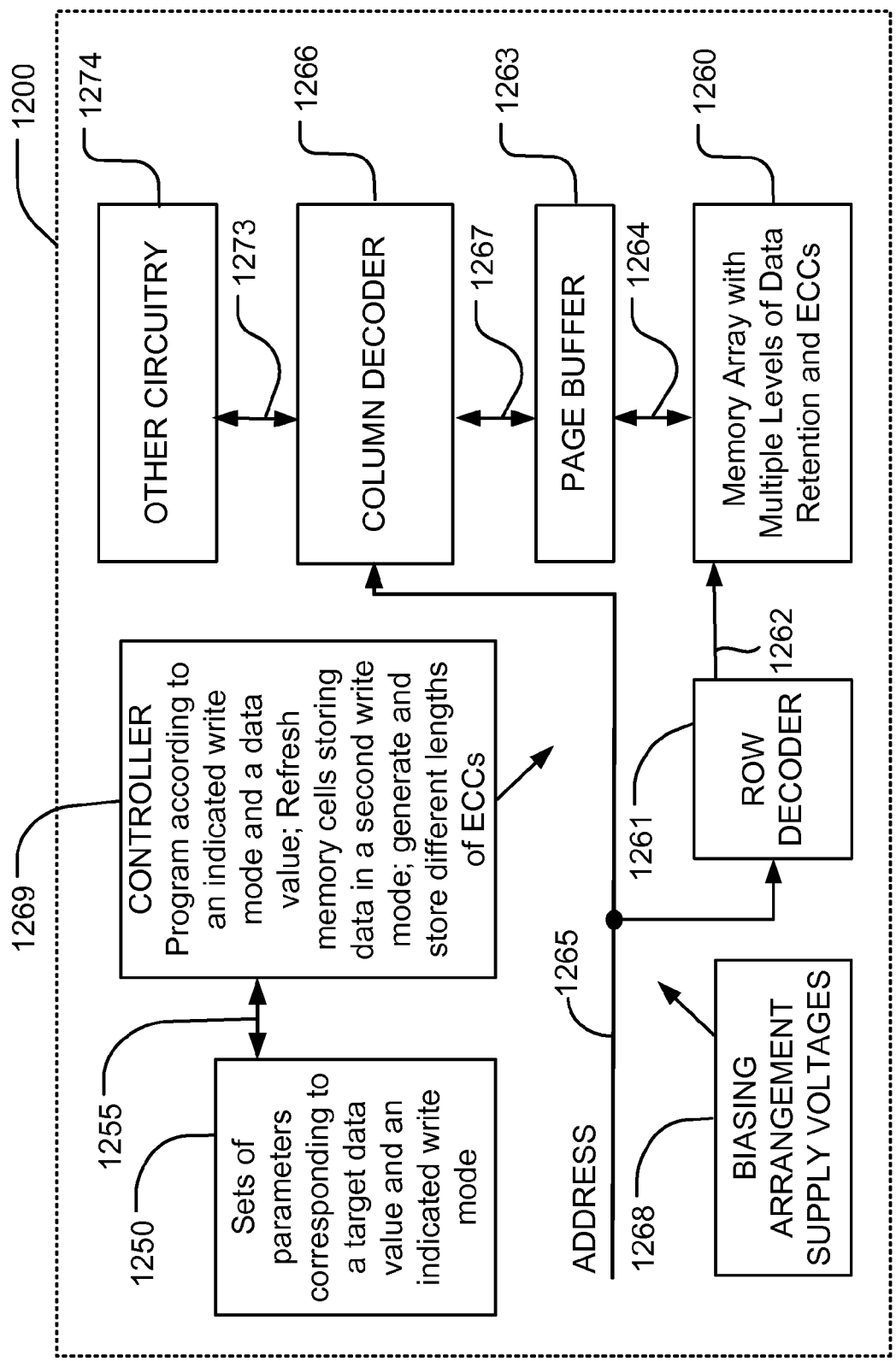
FIG. 12 is a simplified block diagram of an integrated circuit including a memory array with multiple levels of data retention.

FIG. 12 is a simplified block diagram of an integrated circuit 1200 including a memory array 1260 with multiple levels of data retention and error-correcting codes (ECCs). The memory array 1260 can include a plurality of memory cells storing data values corresponding to different sets of resistance ranges, where the memory cells in the plurality of memory cells have a uniform cell structure and the same phase change material. In some embodiments, the memory array 1260 can include single level cells (SLC) (one bit per cell). In other embodiments, the memory array 1260 can include multiple level cells (MLC) (more than one bit per cell). A row decoder 1261 is coupled to a plurality of word lines 1262 arranged along rows in the memory array 1260. Column decoders in block 1266 are coupled to a set of page buffers 1263, in this example via data bus 1267. The global bit lines 1264 are coupled to local bit lines (not shown) arranged along columns in the memory array 1260. Addresses are supplied on bus 1265 to column decoder (block 1266) and row decoder (block 1261). Data is supplied via the data-in line 1273 from other circuitry 1274 (including for example input/output ports) on the integrated circuit, such as a general purpose processor or special purpose application circuitry, or a combination of modules providing system-on-a-chip functionality supported by the memory array 1260.

A controller 1269, implemented for example as a state machine, provides signals to control the application of bias arrangement supply voltages generated or provided through the voltage supply or supplies in block 1268 to carry out the various operations described herein. These operations include read, write, and refresh operations. The controller can be implemented using special-purpose logic circuitry as known in the art. In alternative embodiments, the controller comprises a general-purpose processor, which can be implemented on the same memory, which executes a computer program to control the operations of the device. In yet other embodiments, a combination of special-purpose logic circuitry and a general-purpose processor can be utilized for implementation of the controller.

The controller 1269 is coupled to the memory array 1260 with multiple levels of data retention. The controller includes logic to receive a command to program a data value at a memory cell in the plurality of memory cells, and an indication of which write mode in a plurality of write modes to use. The controller includes logic to execute the iterative write procedure for selecting data retention levels when writing memory cells, such as the procedure illustrated in and described for FIG. 2. The controller includes logic to execute the iterative refresh procedures, such as the procedures illustrated in and described for FIGS. 3-5. The controller executes the iterative write procedure and iterative refresh procedures using sets of parameters corresponding to a target data value and an indicated write mode (1250), such as the parameters described in connection with FIGS. 6, 7, 8A, and 8B that define write pulses. The parameters can be implemented using control registers, hard wired circuits, a memory array such as the memory array 1260, a memory element outside the memory array 1260, etc.

The controller 1269 can also include logic to generate and store different lengths of error-correcting codes (ECCs) on data values in memory cells in the memory storing data in different write modes in the plurality of write modes. As an example, a longer 50-bit ECC can be used with the first write mode for longer data retention, while a shorter 40-bit ECC can be used with the second write mode for shorter data retention.

Figure 13:
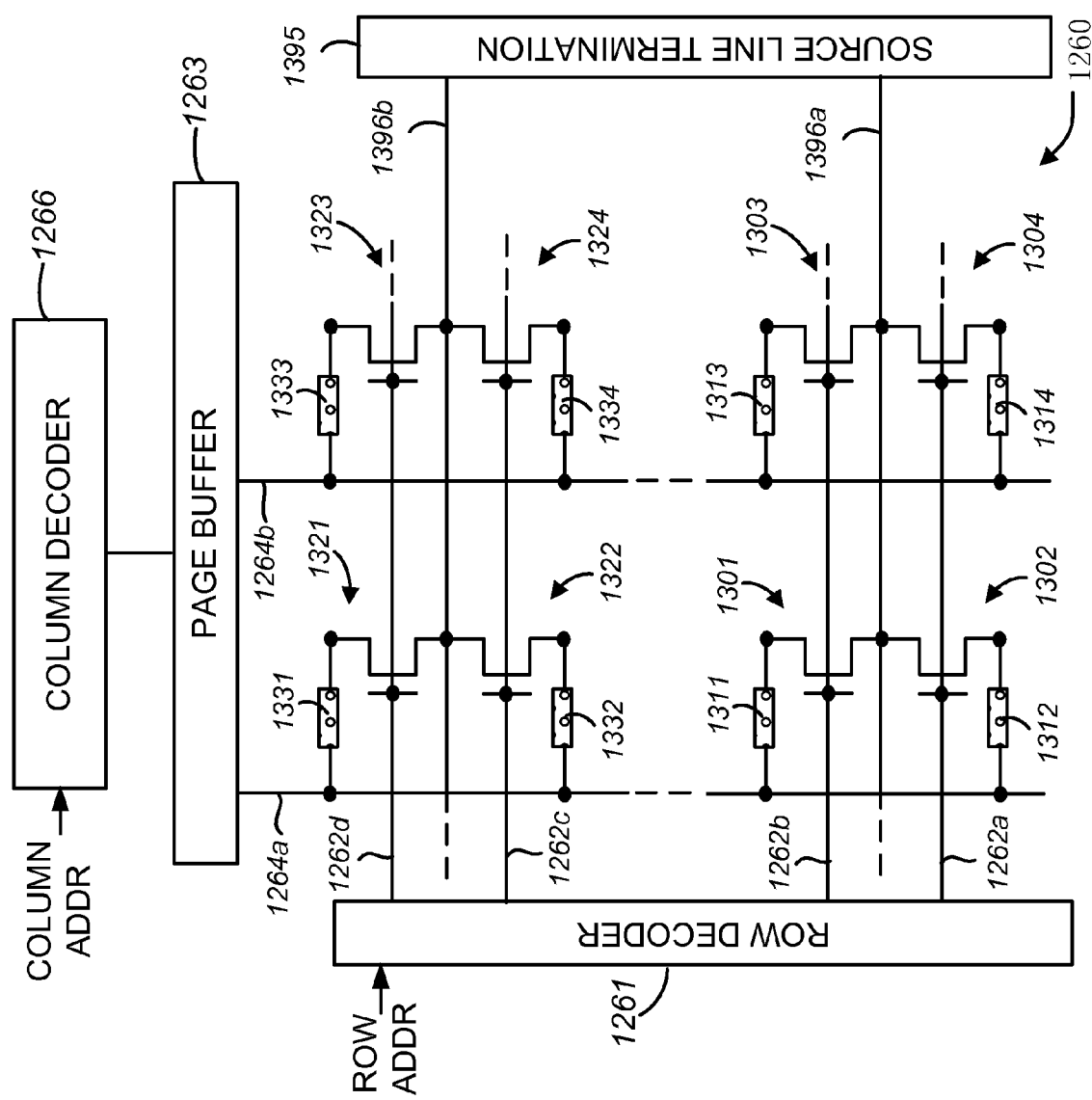
FIG. 13 illustrates a schematic diagram of an embodiment of a portion of memory cells in the memory array.

FIG. 13 illustrates a schematic diagram of an embodiment of a portion of the plurality of memory cells having a uniform cell structure and the same phase change material in the memory array 1260 (FIG. 12). The memory array 1260 includes memory cells 1301, 1302, 1303, and 1304 having respective memory elements 1311, 1312, 1313, and 1314. The memory array 1260 can also include memory cells 1321, 1322, 1323, and 1324 having respective memory elements 1331, 1332, 1333, and 1334.

The memory array 1260 includes a plurality of word lines 1262 (FIG. 12) including word lines 1262*a*, 1262*b*, 1262*c*, and 1262*d* extending in parallel in a first direction, and a plurality of bit lines 1264 including bit lines 1264*a*, 1264*b* extending in parallel in a second direction perpendicular to the first direction.

Sources of each of the four access transistors of memory cells 1301, 1302, 1303, and 1304 illustrated in the memory array 1260 are connected in common to source line 1396*a* that terminates in a source line termination circuit 1395, such as a ground terminal. In another embodiment the sources of the access devices are not electrically connects, but independently controllable. Sources of each of the four access transistors of memory cells 1321, 1322, 1323, and 1324 illustrated in the memory array 1260 are connected in common to source line 1396*b* that terminates in the source line termination circuit 1395.

The source line termination circuit 1395 may include bias circuits such as voltage and current sources, and decoding circuits for applying bias arrangements other than ground to the source lines such as 1396*a* and 1396*b* in some embodiments.

In the illustrated embodiment of FIG. 13, the memory array 1260 includes field effect transistor access devices. Alternatively, other access devices such as diodes or bipolar junction transistors may be used.

FIGS. 14A-14E show alternative memory cell structures which may be implemented in the plurality of memory cells having a uniform cell structure and the same phase change material in the memory array 1260. The alternative memory cell structures can be uniform in a memory array in the sense that the cells in the array have the same structure, such as one of those structures described here, and are manufactured using the same manufacturing process, and that can be used for the technology described herein.

FIG. 14A is a simplified cross-sectional view illustrating a first configuration for memory element 1420 coupled to first and second electrodes 1412, 1414. The first electrode 1412 may, for example, be coupled to a terminal of an access device such as a diode or transistor, while the second electrode 1414 may be coupled to a bit line.

A dielectric spacer 1413 having a width 1415 separates the first and second electrodes 1412, 1414. The phase change material of memory element 1420 extends across the dielectric spacer 1413 and contacts the first and second electrodes 1412, 1414, thereby defining an inter-electrode path between the first and second electrodes 1412, 1414 having a path length defined by the width 1415 of the dielectric spacer 1413. In operation, as current passes between the first and second electrodes 1412, 1414 and through the memory element 1420, the active region 1418 of the phase change material of the memory element 1420 heats up more quickly than the remainder of the memory element 1420.

FIG. 14B is a simplified cross-sectional view illustrating a second configuration for memory element 1420 coupled to first and second electrodes 1422, 1424. The phase change material of the memory element 1420 has an active region 1428 and contacts the first and second electrodes 1422, 1424 at top and bottom surfaces 1423, 1429 respectively. The memory element 1420 has a width 1421 the same as that of the first and second electrodes 1422, 1424.

FIG. 14C is a simplified cross-sectional view illustrating a third configuration for memory element 1420 coupled to first and second electrodes 1432, 1434, the phase change material of memory element 1420 having an active region 1438. The first and second electrodes 1432, 1434 are separated by dielectric spacer 1435. The first and second electrodes 1432, 1434 and the dielectric spacer 1435 have a sidewall surface 1431. The phase change material of memory element 1420 is on the sidewall surface 1431 and extends across the dielectric spacer 1435 to contact the first and second electrodes 1432, 1434.

FIG. 14D is a simplified cross-sectional view illustrating a fourth configuration for memory element 1420 coupled to first and second electrodes 1442, 1444. The phase change material of memory element 1420 has an active region 1448 and contacts the first and second electrodes 1442, 1444 at top and bottom surfaces 1443, 1449 respectively. The memory element 1420 has a width 1441 less than that of the first and second electrodes 1442, 1444.

FIG. 14E is a simplified cross-sectional view illustrating a fifth configuration for memory element 1420 coupled to first and second electrodes 1454, 1452. The first electrode 1454 has a width 1451 less than width 1453 of the second electrode 1452 and memory element 1420. Because of the difference between width 1451 and width 1453, in operation the current density in the phase change material of memory element 1420 is largest in the region adjacent the first electrode 1454, resulting in the active region 1458 having a "mushroom" shape as shown in the Figure.

As described herein, a memory includes a plurality of memory cells storing data values corresponding to different sets of resistance ranges, where the memory cells in the plurality of memory cells have a uniform memory cell structure and the same phase change material. Examples of phase change materials that can be used as the same phase change material for the memory cell structures described herein include chalcogenide based materials and other materials, for the programmable resistance memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory, comprising:
receiving a command to program a data value at a memory cell, and an indication of which write mode in a plurality of write modes to use, write modes in the plurality being characterized by different sets of resistance ranges that correspond to data values stored in the memory cell and including a first write mode and a second write mode corresponding to shorter data retention than the first write mode;
executing a program operation according to the indicated one in the plurality of write modes to program the data value in the memory cell;
refreshing data values in memory cells in the memory storing data in the second write mode using a first refresh process; and
refreshing data values in memory cells in the memory storing data in the first write mode with a second refresh process, the second refresh process causing refreshing at times between refresh different than times between refresh caused by the first refresh process,
wherein the first write mode being characterized by a first set of resistance ranges in the different sets of resistance ranges, and the second write mode being characterized by a second set of resistance ranges in the different sets of resistance ranges.

2. The method of claim 1, wherein the first set of resistance ranges includes at least two resistance ranges that are non-overlapping, and has a margin between the ranges, and the second set of resistance ranges includes at least two resistance ranges that are non-overlapping, and has a margin between the ranges, and wherein the margin between the two resistance ranges in the first set is larger than a corresponding margin between the two resistance ranges in the second set.

3. The method of claim 1, including:
programming the data value at the memory cell by applying a write pulse to the memory cell to change resistance in the memory cell, wherein the write pulse is defined by a set of parameters corresponding to a target data value and the indicated one in the plurality of write modes,
verifying the memory cell by sensing resistance after applying the write pulse; and
if the memory cell fails verify, applying another write pulse to the memory cell defined using the set of parameters or a changed set of parameters.

4. The method of claim 3, wherein the set of parameters includes a falling time of a write pulse from a peak current level to a bottom current level lower than the peak current level.

5. The method of claim 1, wherein the times between refresh caused by the first refresh process are between 1000 and 10000 seconds.

6. The method of claim 1, said periodically refreshing comprising:
sensing resistance of a memory cell in the memory cells storing data in the second write mode;
if the sensed resistance is within a particular resistance range in the second set of resistance ranges or within a margin between the particular resistance range and an adjacent resistance range in the second set of resistance ranges, applying a write pulse to the memory cell to change resistance in the memory cell, wherein the write pulse is defined by a set of parameters corresponding to the particular resistance range;
verifying the memory cell by sensing resistance after applying the write pulse; and
if the memory cell fails verify, applying another write pulse to the memory cell defined using the set of parameters or a changed set of parameters.

7. The method of claim 6, wherein the second set of resistance ranges includes a low resistance range, one or more intermediate resistance ranges and a high resistance range that are non-overlapping, and said periodically refreshing applies the write pulse when the particular resistance range is one of the one or more intermediate resistance ranges and not when the particular resistance range is one of the low resistance range and the high resistance range.

8. The method of claim 1, wherein the second set of resistance ranges includes a low resistance range, one or more intermediate resistance ranges and a high resistance range that are non-overlapping, said periodically refreshing comprising:
sensing resistance of a memory cell in the memory cells storing data in the second write mode;
if the sensed resistance is within a particular resistance range in the one or more intermediate resistance ranges in the second set of resistance ranges or within a margin between the particular resistance range and an adjacent resistance range in the second set of resistance ranges, applying a write pulse to the memory cell to change resistance in the memory cell, wherein the write pulse is defined by a set of parameters corresponding to a first resistance range in the first set of resistance ranges, and the first resistance range represents a same data value as the particular resistance range;
verifying the memory cell by sensing resistance after applying the write pulse; and
if the memory fails verify, applying another write pulse to the memory cell defined using the set of parameters or a changed set of parameters.

9. The method of claim 1, wherein the memory includes a phase change memory array including the memory cell.

10. The method of claim 1, comprising generating and storing different lengths of error-correcting codes on data values in memory cells in the memory storing data in different write modes in the plurality of write modes.

11. A memory, comprising:
a plurality of memory cells storing data values corresponding to different sets of resistance ranges, wherein the memory cells in the plurality of memory cells have a uniform cell structure and the same phase change material; and
a controller coupled to the memory cells, including:
logic to receive a command to program a data value at a memory cell in the plurality of memory cells, and an indication of which write mode in a plurality of write modes to use, write modes in the plurality being characterized by the different sets of resistance ranges that correspond to data values stored in the memory cell and including a first write mode and a second write mode corresponding to shorter data retention than the first write mode;
logic to execute a program operation according to the indicated one in the plurality of write modes to program the data value in the memory cell;
logic to refresh data values in memory cells in the memory storing data in the second write mode using a first refresh process; and
logic to refresh data values in memory cells in the memory storing data in the first write mode with a second refresh process, the second refresh process causing refreshing at times between refresh different than times between refresh caused by the first refresh process, wherein the first write mode being characterized by a first set of resistance ranges in the different sets of resistance ranges, and the second write mode being characterized by a second set of resistance ranges in the different sets of resistance ranges.

12. The memory of claim 11, wherein the first set of resistance ranges includes at least two resistance ranges that are non-overlapping, and has a margin between the ranges, and the second set of resistance ranges includes at least two resistance ranges that are non-overlapping, and has a margin between the ranges, and wherein the margin between the two resistance ranges in the first set is larger than a corresponding margin between the ranges in the second set.

13. The memory of claim 11, the controller including:

logic to program the data value at the memory cell by applying a write pulse to the memory cell to change resistance in the memory cell, wherein the write pulse is defined by a set of parameters corresponding to a target data value and the indicated one in the plurality of write modes, logic to verify the memory cell by sensing resistance after applying the write pulse; and logic to, if the memory cell fails verify, apply another write pulse to the memory cell defined using the set of parameters or a changed set of parameters.

14. The memory of claim 13, wherein the set of parameters includes a falling time of a write pulse from a peak current level to a bottom current level lower than the peak current level.

15. The memory of claim 11, wherein the times between refresh caused by the first refresh process are between 1000 and 10000 seconds.

16. The memory of claim 11, the logic to periodically refresh comprising:

logic to sense resistance of a memory cell in the memory cells storing data in the second write mode, wherein the sensed resistance is within a particular resistance range in the second set of resistance ranges or within a margin between the particular resistance range and an adjacent resistance range in the second set of resistance ranges;

logic to apply a write pulse to the memory cell to change resistance in the memory cell, wherein the write pulse is defined by a set of parameters corresponding to the particular resistance range;

logic to verify the memory cell by sensing resistance after applying the write pulse; and logic to, if the memory cell fails verify, apply another write pulse to the memory cell defined using the set of parameters or a changed set of parameters.

17. The memory of claim 16, wherein the second set of resistance ranges includes a low resistance range, one or more intermediate resistance ranges and a high resistance range that are non-overlapping, and the logic to apply the write pulse applies the write pulse when the particular resistance range is one of the one or more intermediate resistance ranges and not when the particular resistance range is one of the low resistance range and the high resistance range.

18. The memory of claim 11, wherein the second set of resistance ranges includes a low resistance range, one or more intermediate resistance ranges and a high resistance range that are non-overlapping, the logic to periodically refresh comprising:

logic to sense resistance of a memory cell in the memory cells storing data in the second write mode, wherein the sensed resistance is within a particular resistance range in the one or more intermediate resistance ranges in the second set of resistance ranges or within a margin between the particular resistance range and an adjacent resistance range in the second set of resistance ranges;

logic to apply a write pulse to the memory cell to change resistance in the memory cell, wherein the write pulse is defined by a set of parameters corresponding to a first resistance range in the first set of resistance ranges, and the first resistance range represents a same data value as the particular resistance range;

logic to verify the memory cell by sensing resistance after applying the write pulse; and logic to, if the memory fails verify, apply another write pulse to the memory cell defined using the set of parameters or a changed set of parameters.

19. The memory of claim 11, comprising a phase change memory array including the memory cells.

20. The memory of claim 11, the controller including logic to generate and store different lengths of error-correcting codes on data values in memory cells in the memory storing data in different write modes in the plurality of write modes.

* * * * *